(12) United States Patent
Hwang et al.

(10) Patent No.: US 6,368,517 B1
(45) Date of Patent: Apr. 9, 2002

(54) METHOD FOR PREVENTING CORROSION OF A DIELECTRIC MATERIAL

(75) Inventors: Jeng H. Hwang, Cupertino; Kang-Lie Chiang; Guangxiang Jin, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/251,651

(22) Filed: Feb. 17, 1999

(51) Int. Cl.[7] .............................. B44C 1/22; H01L 21/00
(52) U.S. Cl. ........................... 216/67; 216/69; 438/720; 438/738; 438/742
(58) Field of Search ..................... 216/67, 69; 438/738, 438/742, 720

(56) References Cited

U.S. PATENT DOCUMENTS

| | | | |
|---|---|---|---|
| 5,174,856 A | * 12/1992 | Hwang et al. | 216/69 |
| 5,200,031 A | 4/1993 | Latchford et al. | 156/649.1 |
| 5,221,424 A | * 6/1993 | Rhoades | 216/13 |
| 5,269,878 A | 12/1993 | Page et al. | 156/640 |
| 5,397,432 A | 3/1995 | Konno et al. | 156/665 |
| 5,556,714 A | * 9/1996 | Fukuyama et al. | 428/620 |
| 5,599,424 A | * 2/1997 | Matsumoto et al. | 438/738 |
| 5,700,740 A | * 12/1997 | Chen et al. | 438/710 |
| 5,744,402 A | 4/1998 | Fukazawa et al. | 438/734 |
| 5,990,018 A | * 11/1999 | Ho et al. | 438/723 |
| 6,153,530 A | * 11/2000 | Ye et al. | 438/720 |
| 6,162,733 A | * 12/2000 | Obeng | 438/706 |

FOREIGN PATENT DOCUMENTS

| | | | |
|---|---|---|---|
| WO | WO 9711482 | 3/1997 | |
| WO | WO 9800859 | 1/1998 | H01L/21/302 |

OTHER PUBLICATIONS

Copy of International Search Report in corresponding PCT Application No. PCT/US00/04019, mailed Aug. 29, 2000.

* cited by examiner

*Primary Examiner*—Randy Gulakowski
*Assistant Examiner*—Shamim Ahmed
(74) *Attorney, Agent, or Firm*—Shirley Church; Kathi Bean

(57) ABSTRACT

Method for removing or inactivating corrosion-forming etch residues remaining on the surface of a dielectric material after etching a metal layer which is supported by the dielectric material. The surface of the dielectric material which supports the corrosion-forming etch residues is post-etch treated in order to remove the corrosion-forming etch residues. Post-etch treating of the surface of the dielectric material includes disposing the dielectric material in a vacuum chamber having microwave downstream treating gas plasma, or contacting the surface of the dielectric material with deionized water.

32 Claims, 10 Drawing Sheets

METHOD FOR PREVENTING CORROSION OF A DIELECTRIC MATERIAL

BACKGROUND OF THE INVENTION

1. Field of the Invention

This invention provides a method for post-etch treating a dielectric layer on a substrate in order to prevent subsequent corrosion of the dielectric layer. More specifically, the present invention provides a method for removing or inactivating corrosion-forming etch residues remaining on a dielectric layer after etching a metal layer in order to prevent subsequent corrosion of the dielectric layer.

2. Description of the Prior Art

The implementation of digital information storage and retrieval is a common application of modern digital electronics. Memory size and access time serve as a measure of progress in computer technology. Quite often storage capacitors are employed as memory array elements. As the state of the art has advanced, small-feature-size high density dynamic random access memory (DRAM) devices require storage capacitors of larger capacitance having high dielectric constant materials. High dielectric constant materials are made primarily of sintered metal oxide and are becoming attractive to provide the necessary capacitance within a limited space.

Another type of dielectric material or ferroelectric material has perovskite structures to demonstrate a hyteresis loop as voltage is applied. These ferroelectric materials such as strontium bismuth tantalate $SrBi_2Ta_2O_9$ (SBT) or lead zirconate titanate, $Pb(Zr_{1-x}Ti_x)O_3$ (PZT) have been used in non-volatile random access memory (NVPRAM) devices application such as RF-ID Card to fabricate a ferroelectric capacitor.

Among the available high dielectric constant materials or ferroelectric materials, the combination of the compounds barium titanate ($BaTiO_3$) and strontium titanate ($SrTiO_3$) (collectively typically referred to as barium strontium titanate "BST") has been widely studied as one of the more promising high dielectric constant material. To fabricate BST capacitors, a bottom conductive layer, such as platinum, is disposed on a substrate and etched in a pattern to form bottom electrodes. Subsequently a BST layer is deposited on top of the bottom electrodes. A top conductive layer, such as platinum and/or TiN, is subsequently deposited on top of the BST layer and etched in a plasma of an etchant gas to form top electrodes. Because the etchant gas which forms the plasma for etching the top conductive layer contains halogen gases (e.g. $Cl_2$, etc.) and/or halogen-based gases (e.g., $BCl_3$ etc), etching of the top conductive layer leaves halogen-containing residues (e.g., chlorine-containing residues) on the BST layer.

If such halogen-containing residues (regardless of their source) are not removed or inactivated from the BST layer, they will cause corrosion of the BST layer underlying the top electrodes. The BST layer possesses sufficient porosity and permeability such that halogen-containing residue on the BST layer extrudes or permeates into the BST layer from the surface thereof to cause bridging between the bottom and top electrodes. Also, halogen-containing residues may react with moisture to form an acid (e.g., hydrochloric acid) which would attack the surface of the BST layer.

Therefore, what is needed and what has been invented is a method for removing or inactivating corrosion-forming etch residues remaining on the surface of a dielectric material after etching a metal layer which is supported by the dielectric material. What is further needed and what has been invented is a method of preventing corrosion of a dielectric layer disposed on a substrate, especially after etching a contiguous metal layer in a plasma of an etchant gas containing at least one corrosive gas, such as chlorine.

SUMMARY OF THE INVENTION

The present invention provides a method of preventing corrosion of a dielectric layer disposed on a substrate comprising the steps of:

a) providing a substrate supporting a dielectric layer having a corrosive residue on a surface thereof; and b) treating the surface of the dielectric layer of step (a) to remove the corrosive residue and prevent corrosion of the dielectric layer.

The present invention also provides a method of preventing corrosion of a dielectric layer disposed on a substrate comprising the steps of:

a) providing a substrate supporting a dielectric layer and metal layer (e.g., a platinum layer) on the dielectric layer;

b) etching the metal layer of step (a) in a plasma of an etchant gas containing at least one corrosive gas to expose a surface of the dielectric layer and cause the formation of a corrosive residue on the surface of the dielectric layer; and c) post-etch treating the surface of the dielectric layer of step (b) to remove the corrosive residue and prevent corrosion of the dielectric layer.

The present invention further provides a method of preventing corrosion of a dielectric layer disposed on a substrate comprising the steps of:

a) providing a substrate supporting a patterned conductive layer;

b) depositing a dielectric layer on the patterned conductive layer of step (a);

c) depositing a conductive layer on the dielectric layer of step (b);

d) forming a patterned layer on the conductive layer of step (c) such as to expose part of the conductive layer;

e) etching the exposed part of the conductive layer with an etchant gas containing at least one corrosive gas to expose a surface of the dielectric layer and cause a corrosive residue to be deposited on the surface of the dielectric layer; and f) post-etch treating the surface of the dielectric layer of step (e) to remove the corrosive residue and prevent corrosion of the dielectric layer.

The post-etched treating of the surface of the dielectric layer comprises contacting the surface of the dielectric layer with a plasma of a gas, such as a hydrogen-containing gas (e.g., water vapor ($H_2O$), $NH_3$, $H_2$, $CH_4$, $H_2O_2$ and mixtures thereof). Preferably, post-etch treating of the surface of the dielectric layer includes disposing in a reactor chamber under a vacuum the substrate including the dielectric layer having the surface supporting the corrosive residue and contacting the corrosive residue on the surface of the dielectric layer with a microwave downstream hydrogen-containing gas plasma under the following process conditions:

| Process | Parameters |
| --- | --- |
| Gas flow | 50 to 10,000 sccm |
| Pressure, milliToor | 50 to 100,000 milliToor |
| Microwave Power (watts) | 100 to 5000 watts |
| Temperature | 20° C. to 500° C. |
| Time | 30 to 600 secs. |

The dielectric layer comprises a ceramic or ferroelectric material, such as barium titanate ($BaTiO_3$) and/or strontium bismuth tantalate ($SrBi_2Ta_2O_9$, SBT). The dielectric layer may also include strontium titanate ($SrTiO_3$) or a combination of barium titanate ($BaTiO_3$) and strontium titanate ($SrTiO_3$) (i.e. BST) and/or strontium bismuth tantalate ($SrBi_2Ta_2O_9$, SBT) and/or lead zirconium titanate ($Pb(Zr_{1-x}Ti_x)O_3$, PZT).

The foregoing provisions along with various ancillary provisions and features which will become apparent to those skilled in the art as the following description proceeds, are attained by the practice of the present invention, a preferred embodiment thereof shown with reference to the accompanying drawings, by way of example only, wherein:

DESCRIPTION OF THE PREFERRED EMBODIMENTS OF THE INVENTION

Figure 1:
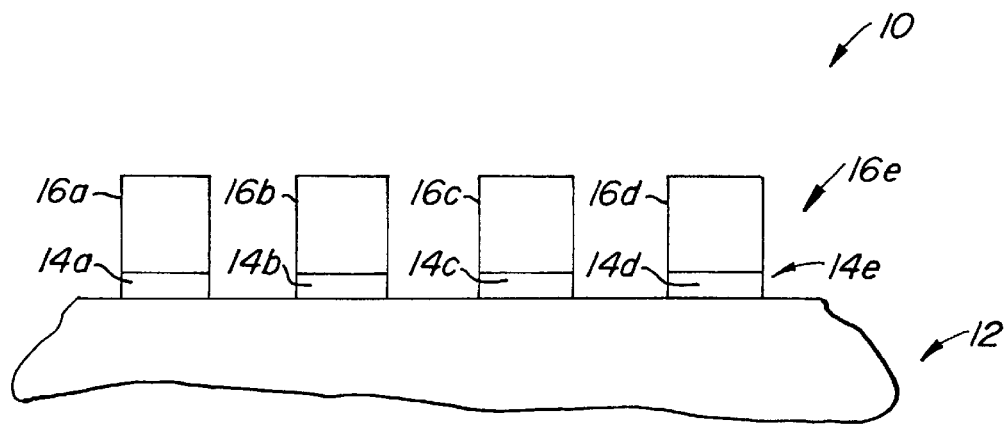
FIG. 1 is a side elevational view of a semiconductor wafer having a patterned electrode layer.

Referring in detail now to the drawings wherein similar parts of the present inventions are identified by like reference numerals, there is seen in FIG. 1 a wafer, generally illustrated as 10, having a semiconductor substrate, generally illustrated as 12. The semiconductor substrate 12 includes regions of circuit elements which do not appear in the drawings, but are well known to those skilled in the art. The wafer 10 also includes a patterned etched barrier layer 14e consisting of barrier members 14a, 14b, 14c and 14d which respectively support a patterned etched conductive layer 16e consisting of metal or conductive layers 16a, 16b, 16c and 16d.

The patterned etched conductive layer 16e may be composed of any metal material or element, such as the precious metals platinum (Pt), iridium (Ir), palladium (Pd), ruthenium (Ru), etc. Because certain metals, such as platinum, easily diffuse or react with certain elements (e.g., a ploy-Si plug) within the semiconductor substrate 12, the patterned etched barrier layer 14e is required between the patterned etched conductive layer 16e and the semiconductor substrate 12. The patterned etched barrier layer 14e preferably comprises titanium and/or a titanium alloy, such as TiN.

The patterned etched conductive layer 16e and the patterned etched barrier layer 14e may have been produced or formulated with any suitable plasma processing apparatus, such as in the reactive ion etch (RIE) plasma processing apparatus sold under the trademark AME8100 Etch™, or under the trademark Precision Etch 5000™, or under the trademark Precision Etch 8300™, all trademarks owned by Applied Materials Inc., 3050 Bowers Avenue, Santa Clara, Calif. 95054-3299. Another suitable plasma processing apparatus for producing or formulating the patterned etched conductive layer 16e and the patterned etched barrier layer 14e is that plasma processing apparatus sold under the trademark Metal Etch DPS Centura™ also owned by Applied Materials, Inc. It is also to be understood that other plasma etchers may be employed, such as ECR, ICP, Helicon Resonance, etc.

Figure 2:
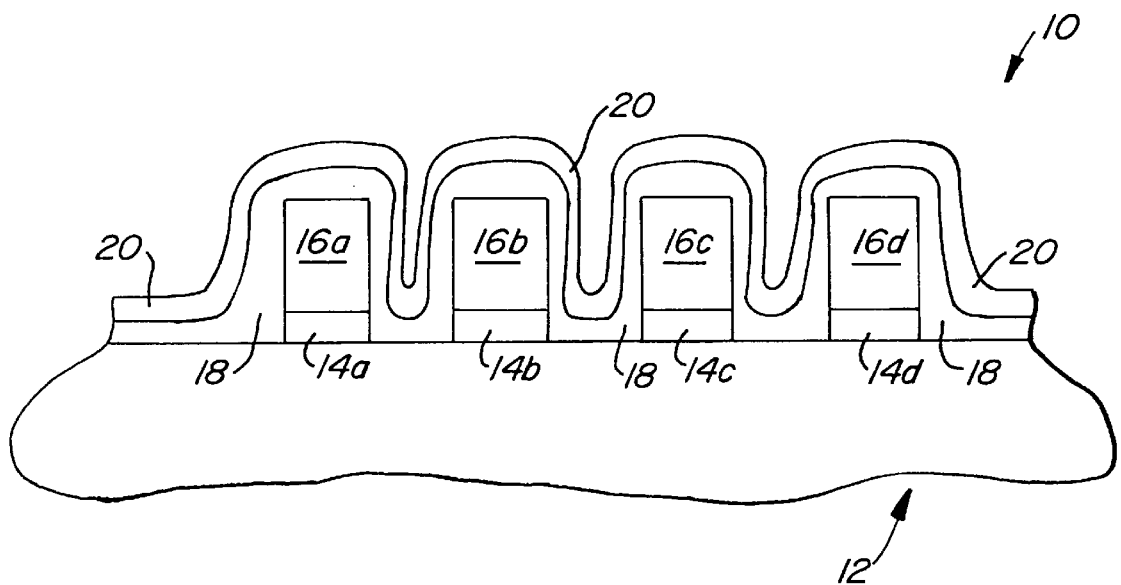
FIG. 2 is a side elevational view of the semiconductor wafer of FIG. 1 after a dielectric layer and a conductive layer were deposited on and over the semiconductor wafer of FIG. 1.

After the wafer 10 has been produced or otherwise provided, a dielectric layer 18 is disposed over the patterned etched conductive layer 16e and over the patterned etched barrier layer 14e, as best shown in FIG. 2. The dielectric layer 18 may be any suitable dielectric or insulator, such as a ceramic (e.g., barium titanate, ($BaTiO_3$)), or a ferroelectric material (e.g., $SrBi_2Ta_2O_9$, known as "SBT," and/or $Pb(Zr_{1-x}Ti_x)O_3$ known as "PZT"), or strontium titanate ($SrTiO_3$), or the combination of barium titanate and/or strontium titanate (collectively known as "BST") and/or strontium bismuth tantalate ($SrBi_2Ta_2O_9$, SBT) and/or lead zircontium titanate ($Pb(Zr_{1-x}Ti_x)O_3$, PZT). The dielectric layer 18 is preferably disposed on and over the patterned etched conductive layer 16e by chemical vapor deposition such as in the processing apparatus sold under the trademark DxZ chamber owned by Applied Materials, Inc. The dielectric layer 18 possesses a thickness ranging from about 50 Angstroms to about 2000 Angstroms, more preferably from about 200 Angstroms to about 1000 Angstroms, most preferably about 300 Angstroms.

A metal or conductive layer 20 is subsequently disposed over and/or on the deposited dielectric layer 18. The conductive layer 20 may be composed of any metal, preferably a metal that is complimentary or identical to the metal of which the patterned etch conductive layer 16e is composed. Thus, if the conductive layer 16e is made from platinum, then the conductive layer 20 is also made from platinum. The thickness of the conductive layer 20 ranges from about 200 Angstroms to about 1000 Angstroms, more preferably from about 400 Angstroms to about 800 Angstroms, most preferably about 600 Angstroms. The conductive layer 20 is preferably disposed on and over the dielectric layer 18 by physical vapor deposition in the plasma processing apparatus sold under the trademark IMP Endura, owned by Applied Materials, Inc., or by chemical vapor deposition.

Figure 3:
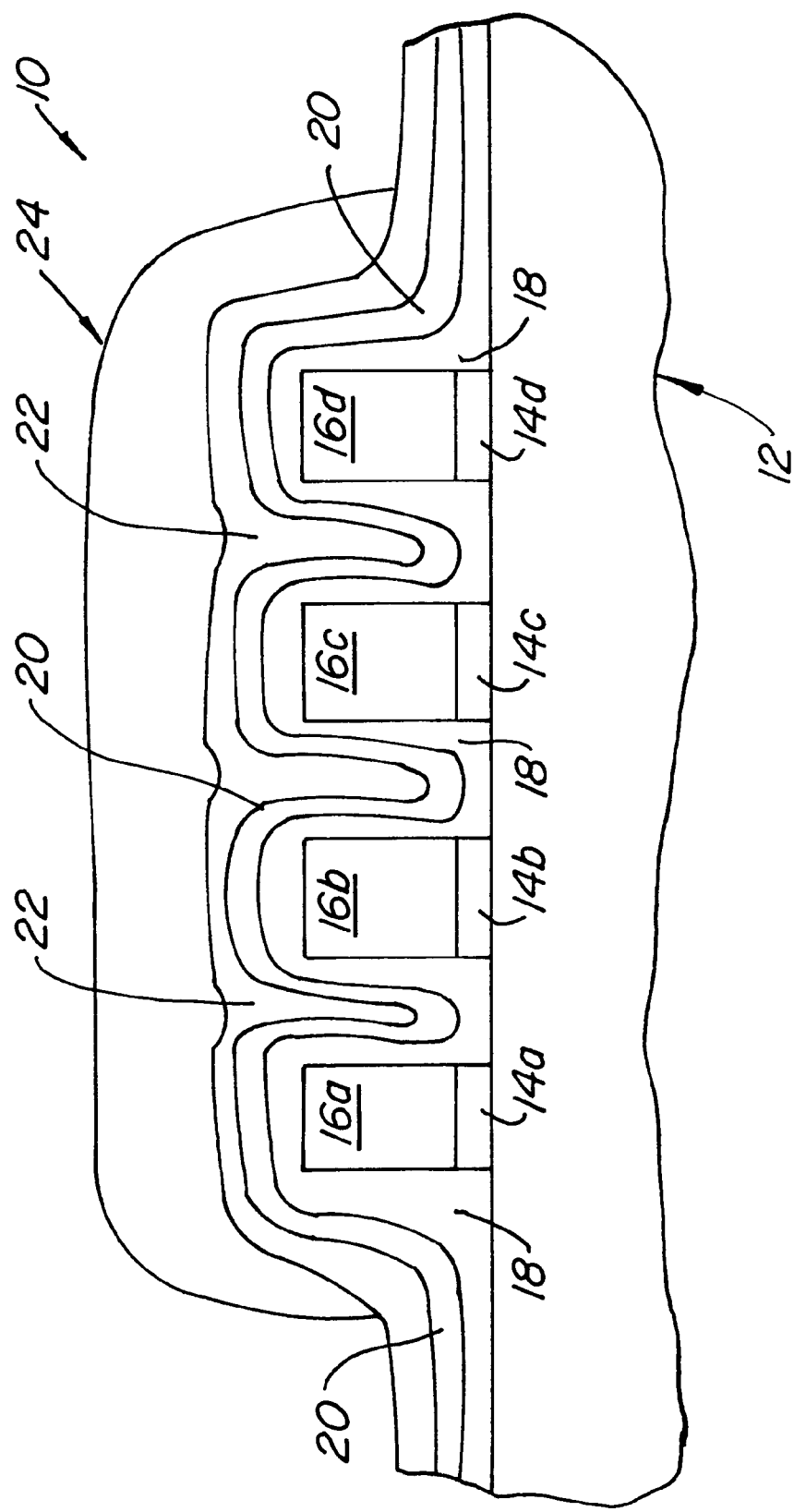
FIG. 3 is a side elevational view of the semiconductor wafer of FIG. 2 after a mask layer and a patterned resist layer were disposed on and over the semiconductor wafer of FIG. 2.

After the conductive layer 20 has been suitably disposed on and/or over the dielectric layer 18, a mask layer 22 is disposed on the conductive layer 20 and a patterned resist (i.e., photoresist), generally illustrated as 24, is selectively positioned on the mask layer 22 as best shown in FIG. 3. Alternatively, the mask layer 22 may be absent such that only the patterned resist 24 is disposed on the conductive layer 20. The mask layer 22 may be any suitable insulation material or conductive material (e.g. TiN) that is capable of being etched in accordance with the procedure described hereinafter such that all traces of the mask layer 22 are essentially removed from the surface of the conductive layer 20 except that portion of the mask layer 22 remaining under the patterned resist 24. The mask layer 22 may also be of any suitable thickness. Preferably, the mask layer 22 comprises silicon dioxide ($SiO_2$) and/or silicon nitride ($SiN_4$) or any other suitable dielectric material. A preferred thickness for the mask layer 22 ranges from about 1000 Angstroms to about 9000 Angstroms, more preferably from about 3000 Angstroms to about 7000 Angstroms, most preferably about 5000 Angstroms. The mask layer 22 is preferably disposed on the conductive layer 20 by chemical vapor deposition.

The patterned resist 24 (i.e., the photoresist 24) may be any suitable layer of material(s) that is capable of protecting any underlying material (e.g., the mask layer 22) from being etched during the etching process of the present invention. Suitable materials for the patterned resist 24 include resist systems consisting of novolac resin and a photoactive dissolution inhibitor (all based on Süss's discovery). Other suitable materials for the resist 24 are listed in an article from the July 1996 edition of Solid State Technology entitled "Deep-UV Resists: Evolution and Status" by Hiroshi Ito. The patterned resist 24 may have any suitable thickness; preferably, the thickness of the patterned resist 24 ranges from about 0.3 μm to about 1.4 μm, more preferably from about 0.5 μm to about 1.2 μm, most preferably about 0.8 μm. The patterned resist 24 is preferably disposed on the mask layer 22 by the spin coating method.

Figure 4:
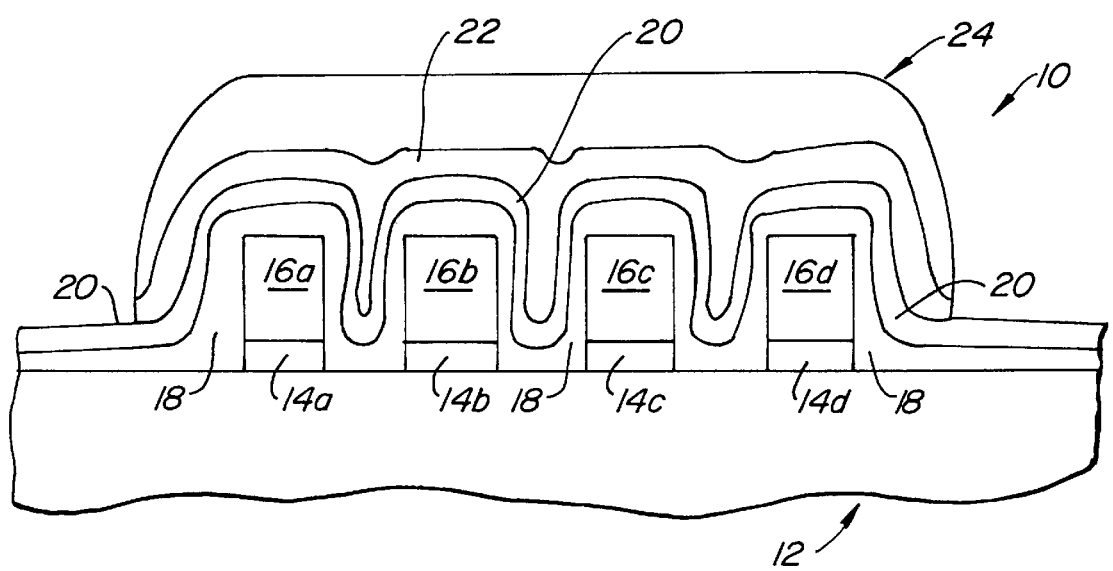
FIG. 4 is a side elevational view of the semiconductor wafer of FIG. 3 after etching and removing a portion of the mask layer from the surface conductive layer to expose selective surfaces of the conductor layer.

In order to form or produce a semiconductor or capacitance device from the multilayered structure of FIG. 3, the multilayered structure is initially placed in a suitable plasma processing apparatus to break through and remove or etch away from the surface of conductive layer 20 the mask layer 22, except that portion of the mask layer 22 that is located underneath the patterned resist 24, as best shown in FIG. 4. A suitable prior art plasma processing apparatus is described in U.S. Pat. No. 5,188,704 to Babie et al., fully incorporated herein by reference thereto as if repeated verbatim immediately hereinafter. Another suitable prior art plasma processing apparatus for breaking through the mask layer 22 is sold under the trademark MxP Centura owned by Applied Materials, Inc.

The foregoing plasma processing apparatus employs a plasma of any suitable etchant gas to break through (i.e., to clean and etch away) the mask layer 22 except that portion of the mask layer 22 that is below the resist 24, as best shown in FIG. 4. For example, if the mask layer 22 contains silicon oxide, suitable etchant gas(es) may be selected from the group consisting of fluorine-containing gases (e.g., $CHF_3$, $SF_6$, $C_2F_6$, $NF_3$, etc.), bromine-containing gases (e.g., HBr, etc.), chlorine-containing gases (e.g., $CHCl_3$, etc.), rare or noble gases (e.g., argon, etc.), and mixtures thereof. Preferably, the etchant gas does not include an oxidant, such as oxygen, since the purpose of this step is to selectively etch the mask layer 22 and not to remove the patterned resist 24. More preferably, the etchant gas comprises from about 20% by volume to about 40% by volume $CHF_3$ and from about 60% by volume to about 80% by volume argon. The preferred reactor conditions for a suitable plasma processing apparatus, such as the MxP Centura™ owned by Applied Materials, for selectively etching mask layer 22 are as follows:

| | |
|---|---|
| Pressure | 10–150 milliTorr |
| RF Power | 500–1500 watts |
| Rotational Magnetic Field | 25–70 Gauss |
| Temperature of Wafer | 25–100° C. |
| Mask Layer 22 Etch Rate | 2000–10,000 Angstroms/min |

The selectivity of mask layer 22 to patterned resist 24 is better than 3:1, depending on the materials employed for the mask layer 22 and the patterned resist 24.

More generally, the process parameters for selectively etching the mask layer 22 in a suitable plasma process apparatus fall into ranges as listed in the following Table I and based on flow rates of the gases $CHF_3$ and Ar also listed in the following Table I:

TABLE I

| Process | Broad | Preferred |
|---|---|---|
| Gas Flow, sccm | | |
| $CHF_3$ | 10 to 50 (20 to 40% by vol.) | 20 to 40 |
| Ar | 50 to 90 (60 to 80% by vol.) | 60 to 80 |
| Pressure, milliTorr | 10 to 250 | 10 to 150 |
| 13.56 MHz RF Power (Watts) | 500 to 2500 | 500 to 1500 |
| Temperature (° C.) of Wafer | 10 to 120 | 25 to 100 |
| Magnetic Field Gauss | 10 to 120 | 25 to 70 |

Figure 5:
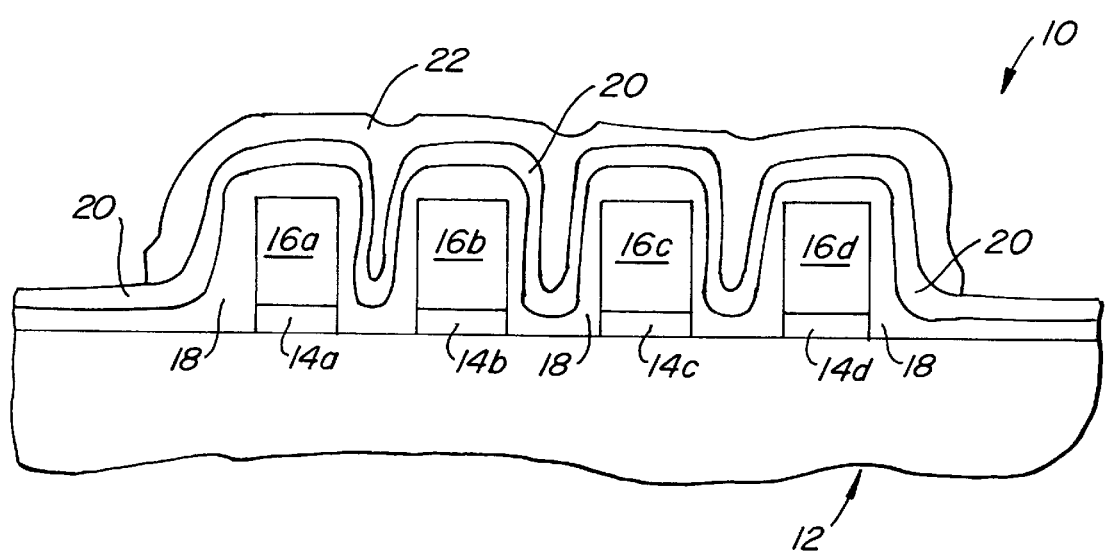
FIG. 5 is a side elevational view of the semiconductor wafer of FIG. 4 after the patterned resist layer was removed from the patterned mask layer.

After selective parts of the mask layer 22 have been etched away from the surface of the conductive layer 20 to expose the latter as best shown in FIG. 4, the patterned resist 24 is removed in any suitable manner such as by using oxygen plasma ashing which is well known to those skilled in the art. The patterned resist member 24 may be stripped from the remaining mask layers 22 with any suitable plasma processing apparatus employing a plasma containing an etchant gas comprising oxygen. Preferably, the patterned resist 24 is removed from the remaining mask layer 22 in an advanced strip passivation (ASP) chamber of a plasma processing apparatus sold under the trade mark Metal Etch MxP Centura to Applied Materials, Inc., 3050 Bowers Avenue, Santa Clara, Calif. 95054-3299. In stripping the patterned resist members 24 from the remaining mask layer 22 the ASP chamber may employ microwave downstream $O_2/N_2$ plasma with the following recipe: 120 second, 250° C., 1400 W, 3000 cc $O_2$, 300 cc $N_2$ and 2Torr. FIG. 5 is a side elevational view of the wafer 10 of FIG. 4 after the patterned resist member 24 has been removed from the remaining mask layer 22.

After the conductive layer 20 has been exposed as represented in FIG. 4, it is etched to develop a pattern. The conductive layer 20 may be etched in any of the previously mentioned plasma processing apparatus that produced or formulated the conductive layers 16a, 16b, 16c and 16d. Another suitable plasma processing apparatus for etching the conductive layer 20 is that plasma processing apparatus sold under the trademark Metal Etch DPS Centura™ also owned by Applied Materials, Inc. It is also to be understood that other plasma etchers may be employed, such as ECR, ICP, Helicon Resonance, etc. Process conditions for etching the conductive layer 20, especially if the conductive layer 20 includes platinum, may be any suitable process conditions, depending on the plasma processing apparatus employed. The etchant gas for etching the conductive layer 20 when the conductive layer 20 includes platinum preferably broadly comprises a halogen containing gas, such as a halogen gas (e.g., fluorine, chlorine, bromine, iodine, and astatine), and/or a halogen source gas (e.g. HBr, $BCl_3$, etc), and a noble gas such as helium, neon, argon, krypton, xenon, and radon. Preferably, the etchant gas comprises or consists of or consists essentially of a halogen (preferably chlorine) and a noble gas selected from the group consisting of helium, neon, and argon. The noble gas is preferably argon. The etchant gas more specifically comprises preferably from about 20% by volume to about 95% by volume of the halogen gas (i.e., chlorine) and from about 5% by volume to about 80% by volume of the noble gas (i.e. argon); more preferably from about 40% by volume to about 80% by volume of the halogen gas (i.e., chlorine) and from about 20% by volume to about 60% by volume of the noble gas (i.e. argon); most preferably from about 55% by volume to about 65% by volume of the halogen gas (i.e., chlorine) and from about 35% by volume to about 45% by volume of the noble gas (i.e., argon).

In a preferred embodiment of the invention, the conductive layer 20 consists essentially of platinum or iridium, and the reactor conditions for a suitable plasma processing apparatus in etching such a conductive layer 20 are as follows:

| | |
|---|---|
| Pressure | 0.1–300 milliTorr |
| RF Power | 100–5000 watts |
| Rotational Magnetic Field | 20–100 Gauss |
| Temperature of Wafer | about 150–about 500° C. |

More generally, the process parameters for etching the conductive layer 20 consisting of platinum or iridium in a suitable plasma processing apparatus fall into ranges as listed in the following Table II and based on the flow rate of etchant gas as also listed in Table II below:

TABLE II

| Process | Broad | Preferred | Optimum |
|---|---|---|---|
| Gas Flow, sccm | | | |
| Etchant Gas | 50 to 500 | 75 to 250 | 100 to 200 |
| Pressure, milliTorr | 20 to 2000 | 30 to 300 | 50 to 150 |
| 13.56 MHz RF Power (Watts) | 50 to 3000 | 500 to 2000 | 700 to 1200 |
| Magnetic Field Gauss | 0 to 140 | 20 to 100 | 60 to 80 |

The conductive layer 20, especially when the conductive layer 20 includes platinum or iridium, may be etched in a high density plasma (i.e. plasma of the etchant gas having an ion density greater than about $10^9/cm^3$, preferably greater than about $10^{11}/cm^3$) or a low density plasma. The source of the high density plasma or the low density plasma may be any suitable respective high density source or low density source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The high density plasma or the low density plasma for the present invention may be produced or provided by inductively coupling a plasma in a decoupled plasma source etch chamber, such as that sold under the trademark DPS™ owned by Applied Materials, Inc. which decouples or separates the ion flux to the wafer 10 and the ion acceleration energy. The design of the etch chamber provides fully independent control of ion density of an enlarged process window. This is accomplished by producing plasma via an inductive source. While a cathode within the etch chamber is still biased with rf electric fields to determine the ion acceleration energy, a second rf source (i.e., an inductive source) determines the ion flux. This second rf source is not capacitive (i.e., it does not use electric fields like the cathode) since a large sheath voltage would be produced, interfering with the cathode bias and effectively coupling the ion energy and ion flux.

The inductive plasma source couples rf power through a dielectric window rather than an electrode. The power is coupled via rf magnetic fields (not electric fields) from rf current in a coil. These rf magnetic fields penetrate into the plasma and induce rf electric fields (therefore the terms "inductive source") which ionize and sustain the plasma. The induced electric fields do not produce large sheath voltages like a capacitive electrode and therefore the inductive source predominantly influences ion flux. The cathode bias power plays little part in determining ion flux since most of the rf power (typically an order of magnitude less than the source power) is used in accelerating ions. The combination of an inductive plasma source and a capacitive wafer bias allows independent control of the ion flux and ion energy reaching the wafer 10 in the etch chamber, such as the DPS™ brand etch chamber, which may be any of the DPS™ brand etch chambers of the inductively coupled plasma reactor disclosed in U.S. Pat. No. 5,753,044, entitled RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter.

The preferred reactor conditions for a suitable inductively coupled RF plasma reactor, such as the inductively coupled RF plasma reactor disclosed in U.S. Pat. No. 5,753,044, in etching the conductive layer 20, especially when the conductive layer 20 consists of platinum or iridium, are as follows:

| | |
|---|---|
| Pressure | 0.1 to 300 milliTorr |
| RF Power to Coil Inductor | 100 to 5000 watts |
| RF Power to Wafer Pedestal | 50 to 3000 watts |
| RF Frequency in Coil Inductor | 100 K to 300 MHz |
| RF Frequency in Wafer Pedestal | 100 K to 300 MHz |

-continued

| | |
|---|---|
| Temperature of Wafer | 20 to 500° C. |
| Conductive Layer 20 Etch Rate | 200 to 6000 Angstrom/min |

More generally, the process parameters for etching the conductive layer 20, especially when the conductive layer 20 consists of platinum or iridium, in a suitable inductively coupled plasma reactor, such as the inductively coupled RF plasma reactors disclosed in U.S. Pat. No. 5,753,044, fall into ranges as listed on the basis of flow rates of the gases, including the halogen gas(es) (i.e., $Cl_2$) and the noble gas(es) (i.e., argon), as listed in Table III below.

TABLE III

| Process | Broad | Preferred | Optimum |
|---|---|---|---|
| Gas Flow, sccm | | | |
| $Cl_2$ | 30 to 400 | 50 to 250 | 60 to 150 |
| Ar | 20 to 300 | 30 to 200 | 40 to 100 |
| Pressure, milliTorr | 0.1 to 300 | 10 to 100 | 10 to 40 |
| RF Power of Coil Inductor (Watts) | 100 to 5000 | 650 to 2000 | 900 to 1500 |
| RF Power of Wafer Pedestal (Watts) | 50 to 3000 | 100 to 1000 | 150 to 400 |
| Temperature of Wafer (° C.) | 20 to 500 | 40 to 350 | 80 to 325 |
| Conductive Layer 20 Etch Rate (Å/min) | 200 to 6000 | 500 to 3000 | 1000 to 2000 |
| RF Frequency of Coil Inductor | 100 K to 300 MHz | 400 K to 20 MHz | 2 to 13.5 MHz |
| RF Frequency of Wafer Pedestal | 100 K to 300 MHz | 400 K to 20 MHz | 400 K to 13.5 MHz |

Figure 6:
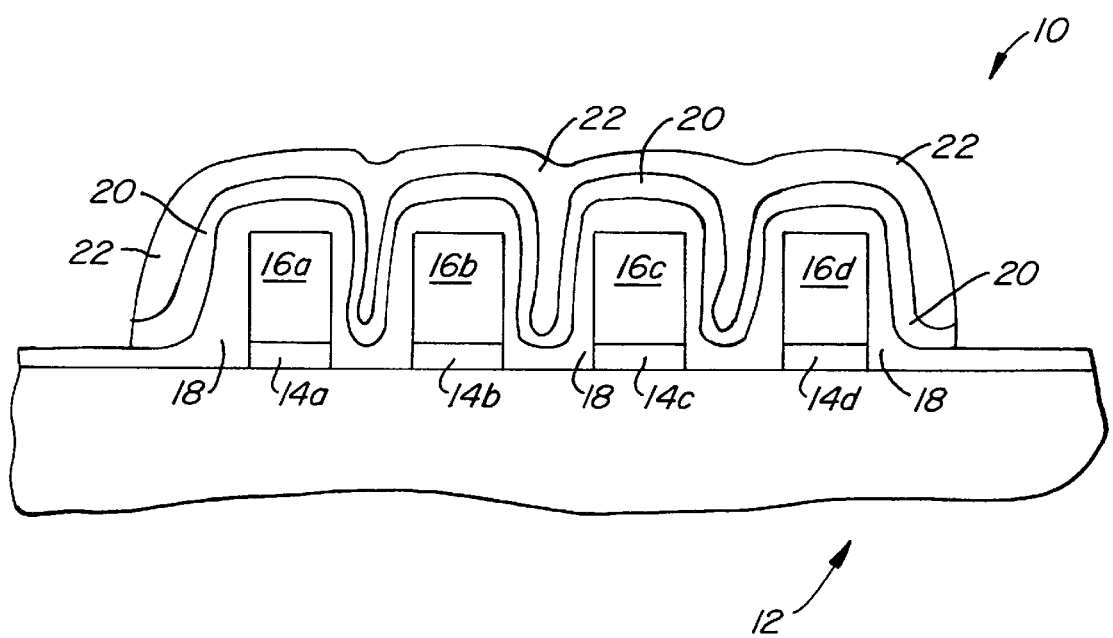
FIG. 6 is a side elevational view of the semiconductor wafer of FIG. 5 after the conductive layer were etched and patterned to expose selective surfaces of the dielectric layer.

After the conductive layer 20 has been etched, a capacitor is formed with the etched conductive layer 20 (i.e. the remaining conductive layer after etching the original conductive layer 20) being a common conductor for conductive layers 16a, 16b, 16c and 16d, as best shown in FIG. 6. In another preferred embodiment of the present invention, the previously mentioned procedure for producing the capacitor of FIG. 6 may be reversed such that the common conductor (i.e. conductive layer 20) is the bottom electrode and conductive layers 16a, 16b, 16c and 16d become the top electrode. As is well known to those skilled in the art, the conductive layer 20 would be deposited on the semiconductor 12, followed by depositing the dielectric layer 18 on the conductive layer 20. Another conductive layer would then be deposited on the dielectric layer and etched with the assistance of a suitable mask or resist to produce conductive layers 16a, 16b, 16c and 16d as best shown in FIG. 8.

Figure 7:
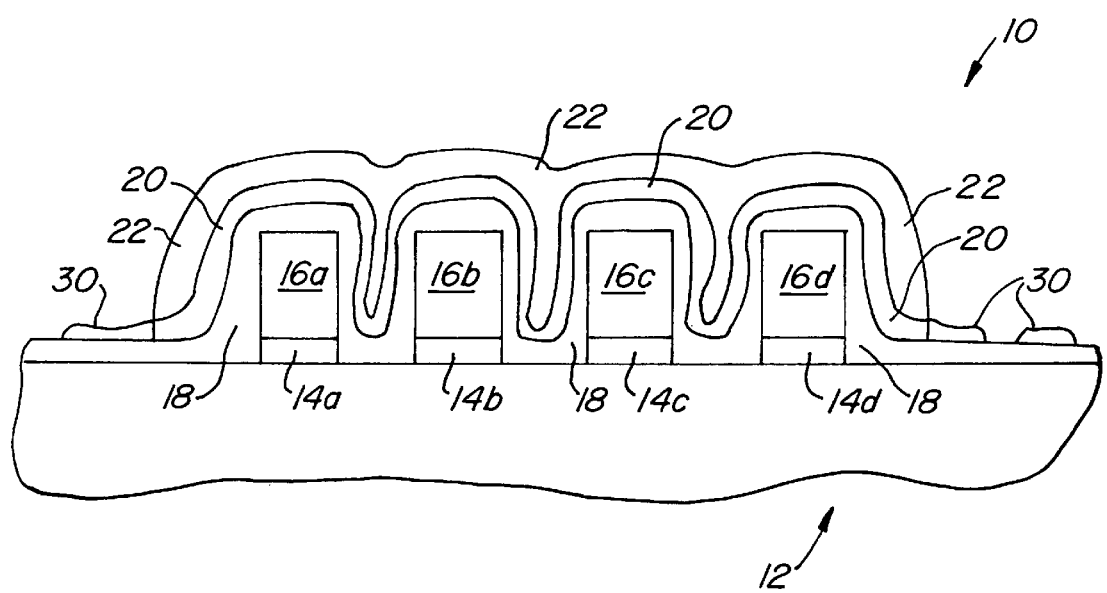
FIG. 7 is a side elevational view of the semiconductor wafer of FIG. 6 after a corrosive residue was deposited on the selective surfaces of the dielectric layer.

During the etching and after selectively removing parts of the conductive layer 20 from the surface of the dielectric layer 18, a residue 30 (as best shown in FIG. 7) forms on the exposed surface of the dielectric layer 18. For the preferred embodiment of the invention illustrated in FIG. 8, the residue 30 results from forming the etched conductive layers 16a, 16b, 16c and 16d, and is represented by dashed or broken lines in FIG. 8. The residue 30 is typically complex in that it contains etchants and reaction by-products, as well as inorganic materials. If the conductive layer 20 consists of platinum or iridium, then the residue 30 would contain platinum or iridium, as well as oxides and silicon-containing material, especially if the mask layer 22 comprises $SiO_2$ or $Si_3N_4$. If the etchant gas contains a corrosive gas, such as a halogen (e.g. $Cl_2$) or a halogen-source gas(e.g. HBr, $BCl_3$, etc.), then the residue 30 would be a corrosive residue which may form corrosive salts and/or corrosive acids. For example, if the etchant gas comprises chlorine, which is one of the preferred gases for etching platinum or iridium as was previously mentioned, then the residue 30 would contain corrosive chlorine which may react with moisture ($H_2O$) to form hydrochloric acid (HCl) that can permeate into the dielectric layer 18 and cause post-etch corrosion, including bridging openings or non-dielectric channels between the bottom conductive layers and the upper conductive layer 20. For the preferred embodiment of the invention illustrated in FIG. 8, openings or non-dielectric channels would be formed between the bottom conductive layer 20 and the top conductive layers 16a, 16b, 16c and 16d. Referring now to FIG. 9, there is seen a picture partially representing the drawing of FIG. 8 illustrating an etched platinum electrode separated by BST dielectric layers 18 having corrosive residue 30 thereon as a result of having etched a platinum layer to form the etched platinum electrodes. Therefore, the dielectric layer 18 is preferably post-etch treated in accordance with the present invention in order to strip away or otherwise remove the residue 30 from the dielectric layer 18.

In another preferred embodiment of the invention, the residue 30 is removed with or by deionized (DI) water. The wafer 10 would be immersed in a container having DI water which would contact and the dissolve the residue 30. The wafer 10 may be rotated or otherwise agitated in the container having DI water. Alternatively, the DI water may be ejected, or otherwise flowed against under pressure, to remove the residue 30.

Figure 8:
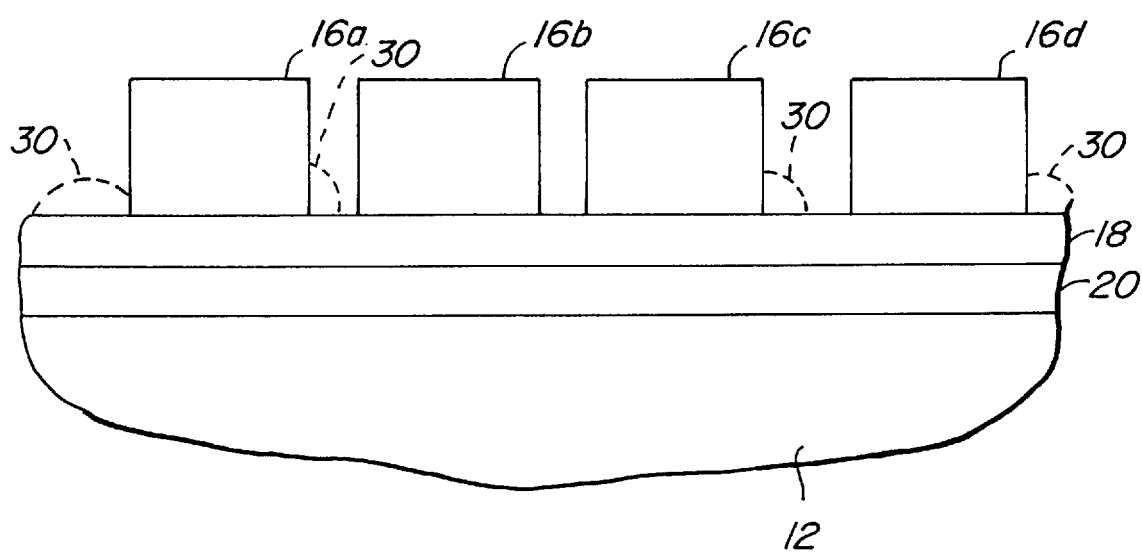
FIG. 8 is a side elevational view of a semiconductor wafer produced by procedures which are reversed from the procedures of the present invention and includes the bottom electrode as the common conductor for a top electrode represented by a plurality of conductive layers.
Figure 9:
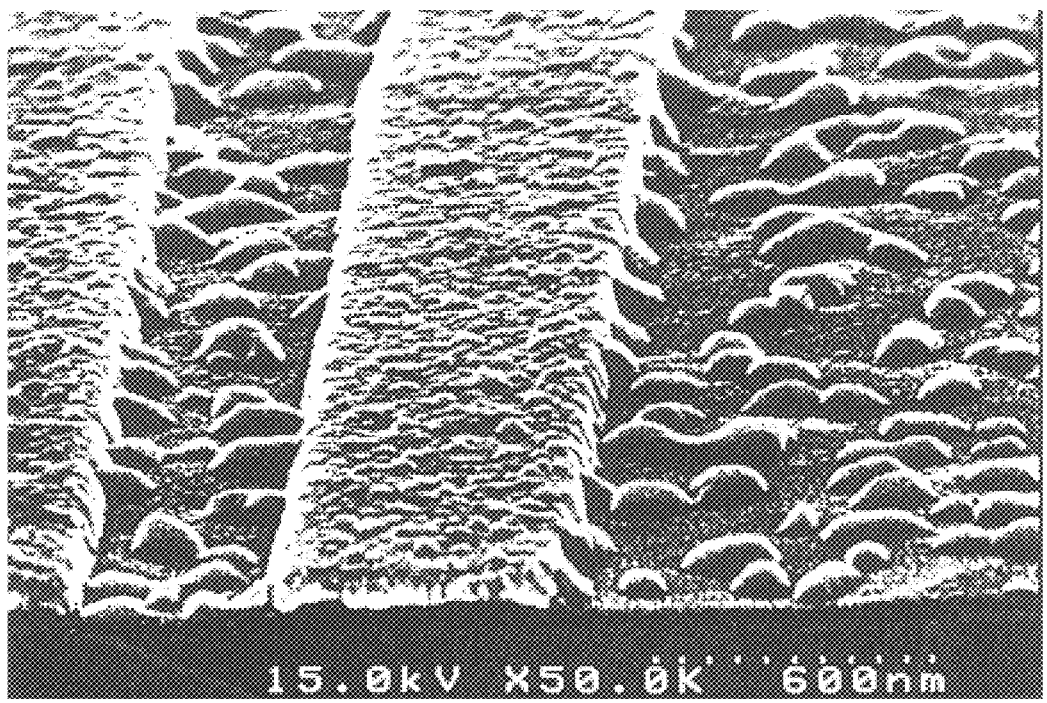
FIG. 9 is a picture partially representing the drawing of FIG. 8 illustrating an etched platinum electrode separated by BST dielectric layers supporting corrosive residue.

In another preferred embodiment of the invention, the residue 30 is removed from the dielectric layer 18 by disposing the multilayered wafer 10 of FIG. 7 or FIG. 8 in a vacuum chamber. A preferred vacuum chamber is an advanced strip passivation (ASP) chamber of a plasma processing apparatus sold under the trademark Precision Etch 5000™ owned by Applied Materials, Inc. A schematic representation of the ASP chamber is generally illustrated as 50 in FIG. 10. The ASP chamber 50 includes a chamber body 54 supporting a chamber lid 60 which communicates with a plasma tube 62 circumscribed with a 2.45 GHz wave guide 64 and cooling fins 66. The wafer 10 rests on a wafer basket 68. The ASP chamber 50 is maintained at a pressure ranging from about 0.5 to about 3 Torr, typically about 2 Torr. The temperature of the wafer 10 is within the range of from about 40° C. to about 350° C.

Plasma of a gas is introduced in the ASP chamber 50 through its associated plasma tube 62. The gas is preferably a hydrogen-containing gas selected from the group consisting of $H_2O$ (water vapor), ammonia ($NH_3$), hydrogen ($H_2$), methane ($CH_4$), hydrogen peroxide ($H_2O_2$), forming gas ($H_2+N_2$), and mixtures thereof. More preferably, the hydrogen-containing gas is selected from the group consisting of ammonia ($NH_3$), water vapor ($H_2O$) and mixtures thereof. In another preferred embodiment of the invention, the hydrogen-containing gas may be admixed with a non-hydrogen-containing gas, such as nitrogen, oxygen or any noble gas (e.g., argon).

Figure 10:
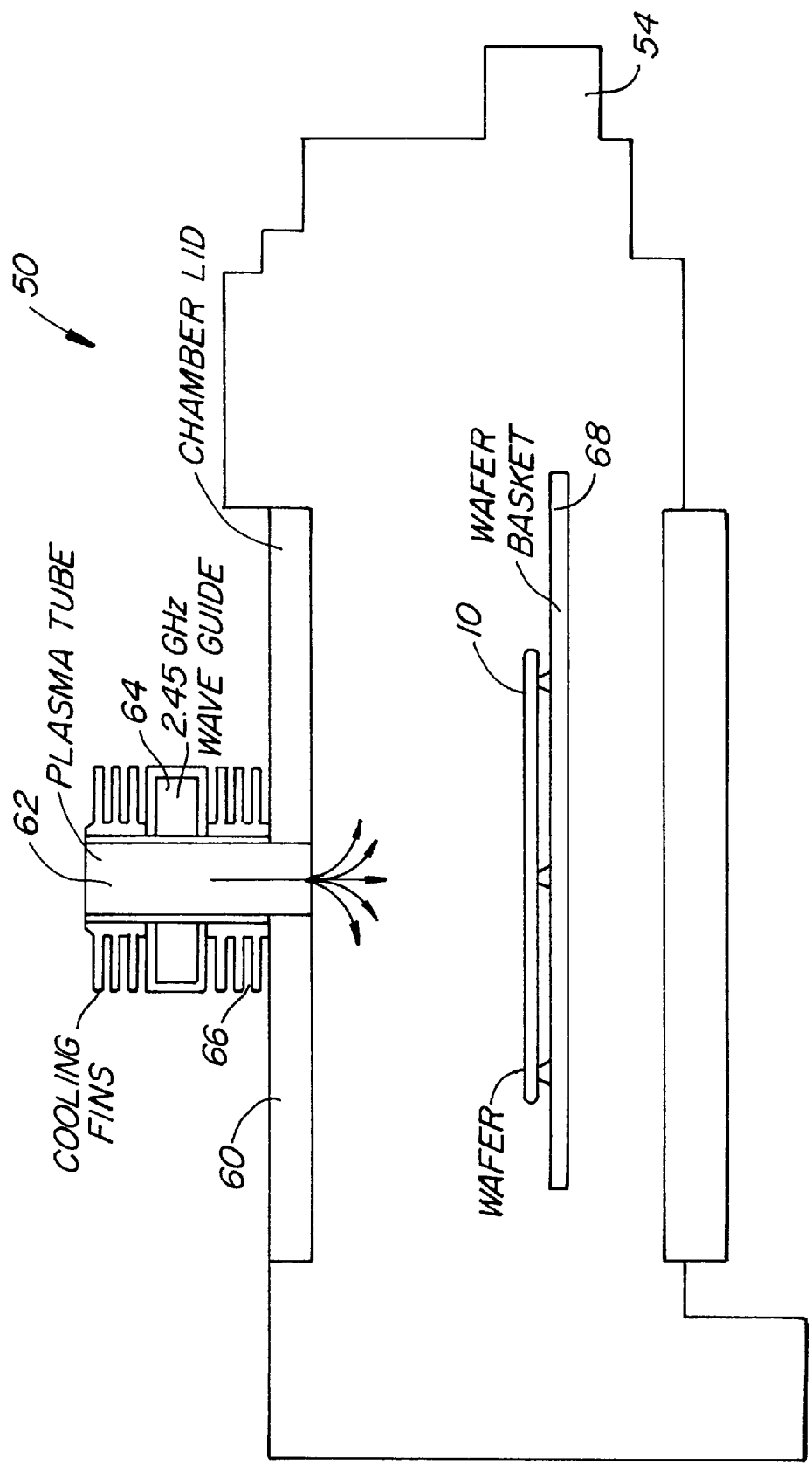
FIG. 10 is a schematic view of chamber for stripping away the corrosive residue from the selective surfaces of the dielectric layer.

While any type of conventionally generated plasma may, in general, be used in the practice of the invention, preferably the plasma used in the process of the invention is generated by a microwave plasma generator such as, for example, a Model AURA-plasma generator commercially available from the GaSonic division of Atomel Corporation of Sunnyvale, Calif., which is located upstream of the ASP chamber 50. In this type of apparatus as illustrated in FIG. 10, the gas flowing toward the ASP chamber 50 first passes through the microwave plasma tube 62 located upstream of the ASP chamber 50 and the plasma generated therein produces reactive species from the gases flowing through the plasma tube 64 to the ASP chamber 50 and such reactive species then flow into the ASP chamber 50 for stripping the residue 30 from the surface of the dielectric layer 18.

More generally, the process parameters for stripping the residue 30 from the dielectric layer 18 in a suitable plasma processing apparatus, such as the plasma processing apparatus of FIG. 10, fall into ranges as listed in the following Table IV and based on the flow rate of hydrogen-containing gas as also listed in Table IV below:

TABLE IV

| Process<br>Gas Flow, sccm | Broad | Preferred | Optimum |
|---|---|---|---|
| Hydrogen-containing Gas | 50 to 500 | 75 to 250 | 100 to 200 |
| Pressure, milliTorr | 50 to 100,000 | 500 to 50,000 | 1000 to 5,000 |
| Microwave Power (Watts) | 100 to 5000 | 50 to 4000 | 1000 to 3000 |
| Temperature (° C.) of Wafer | 20 to 500 | 80 to 450 | 200 to 350 |
| Time (secs) | 30 to 600 | 40 to 200 | 60 to 120 |

In another preferred embodiment of the invention, the treating gas includes a hydrogen-containing gas and a non-hydrogen-containing gas, and the process parameters for removing the residue 30 from the surface of the dielectric layer 18 in a suitable plasma processing apparatus, such as the plasma processing apparatus of FIG. 10, fall into ranges as listed in the following Table V on the basis of flow rates of the gases, including hydrogen-containing gas and non-hydrogen-containing gas, as also listed in Table V below.

TABLE V

| Process<br>Gas Flow, sccm | Broad | Preferred | Optimum |
|---|---|---|---|
| Hydrogen-containing Gas | 30 to 400 | 50 to 250 | 60 to 150 |
| Non-hydrogen-containing Gas | 20 to 300 | 30 to 200 | 40 to 100 |
| Pressure, milliTorr | 50 to 100,000 | 500 to 50,000 | 1000 to 5000 |
| Microwave (Watts) | 100 to 5000 | 500 to 4000 | 1000 to 3000 |
| Temperature of Wafer (° C.) | 20 to 500 | 80 to 450 | 200 to 350 |
| Time (secs) | 30 to 600 | 40 o 200 | 60 to 120 |

The treating gas(es) are flowed through the plasma tube 62 into the ASP chamber 50 for a period of at least about 5 seconds (e.g. from about 5 secs to about 10 secs), after which a plasma having a power level of from about 1000 watts to about 5000 watts, typically about 1400 watts, is then ignited in the plasma generator, preferably upstream of the ASP chamber 50, and maintained for a period of at least about 60 seconds (e.g. from about 60 secs. to about 120 secs.), preferably at least about 60 seconds, during which time the flow of the hydrogen-containing gas(es) through the plasma generator into the ASP chamber 50 is maintained. Longer periods of time can be used, both for the gas flow prior to the plasma ignition, as well as the period during which the plasma remains on, but such longer periods are deemed to be unnecessary.

After the plasma is extinguished and the flow of treating gas(es) shut off, the wafer 10 may be removed from the ASP chamber 50 and subject to further processing, e.g., topside processing, as desired. The process of the invention removes or inactivates a sufficient amount of any corrosive containing residue (i.e., residue 30), such as chlorine-containing residues, remaining from prior metal etching to provide freedom for the dielectric layer 18 from any corrosion.

In another preferred embodiment of the invention, the residue is removed from the dielectric layer 18 by disposing the multilayered wafer 10 of FIG. 7 or FIG. 8 in a DPS™ brand etch chamber. When the gas of the plasma in the DPS™ brand chamber comprises hydrogen-containing gas (es), the process conditions for removing the residue 30 fall into the ranges as listed in the following Table VI and based on the flow rate of hydrogen-containing gas as also listed in Table VI below:

TABLE VI

| Process<br>Gas Flow, sccm | Broad | Preferred | Optimum |
|---|---|---|---|
| Hydrogen-containing gas | 30 to 500 | 50 to 250 | 100 to 200 |
| Pressure, mT | 0.1 to 300 | 10 to 100 | 10 to 40 |
| RF Power of Coil Inductor (Watts) | 100 to 5000 | 650 to 3000 | 1000 to 2000 |
| RF Power of Wafer Pedestal (Watts) | 50 to 3000 | 100 to 1000 | 150 to 300 |
| Temperature of Wafer (° C.) | 20 to 500 | 60 to 350 | 80 to 250 |
| Treating Time (seconds) | 30 to 600 | 40 to 300 | 60 to 150 |
| RF Frequency of Coil Inductor | 100 K to 300 MHz | 400 K to 20 MHz | 2 to 13.5 MHz |
| RF Frequency of Wafer Pedestal | 100 K to 300 MHz | 400 K to 20 MHz | 400 K to 13.5 MHz |

In another preferred embodiment of the invention where the gas of the plasma in the DPS™ brand chamber comprises hydrogen-containing gas and non-hydrogen-containing gas, the process conditions for removing the residue 30 fall into the ranges as listed in the following Table VII and based on the flow rate of the hydrogen-containing gas(es) and the non-hydrogen-containing gas(es) as also listed in Table VII below:

TABLE VII

| Process<br>Gas Flow, sccm | Broad | Preferred | Optimum |
|---|---|---|---|
| Hydrogen-containing gas | 20 to 300 | 50 to 200 | 60 to 150 |
| Non-hydrogen-containing gas | 20 to 200 | 30 to 150 | 40 to 120 |
| Pressure, mT | 0.1 to 300 | 10 to 100 | 10 to 40 |
| RF Power of Coil Inductor (Watts) | 100 to 5000 | 650 to 3000 | 1000 to 2000 |
| RF Power of Wafer Pedestal (Watts) | 50 to 3000 | 100 to 1000 | 150 to 300 |
| Temperature of Wafer (° C.) | 20 to 500 | 60 to 350 | 80 to 250 |
| Treating Time (seconds) | 30 to 600 | 40 to 300 | 60 to 150 |
| RF Frequency of Coil Inductor | 100 K to 300 MHz | 400 K to 20 MHz | 2 to 13.5 MHz |
| RF Frequency of Wafer Pedestal | 100 K to 300 MHz | 400 K to 20 MHz | 400 K to 13.5 MHz |

It will be appreciated by those skilled in the art that the process and reactor conditions of Tables I–VII, as well as other process and reactor conditions described herein, may vary in accordance with the size of the wafer 10.

The invention will be illustrated by the following set forth example which is being given to set forth the presently known best mode and by way of illustration only and not by way of any limitation. All parameters such as concentrations, mixing proportions, temperatures, pressure, rates, compounds, etc., submitted in this example are not to be construed to unduly limit the scope of the invention.

EXAMPLE 1

A test semiconductor wafer was formulated with the following film stack:

1.2 μm patterned PR (photoresist)/5000 Å Oxide/1000 Å TiN/1000 Å Pt/300 Å BST/Si.

The feature size of the patterned PR test semiconductor wafer was 0.35 μm line and 0.35 μm spacing. The oxide mask (i.e. the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the oxide mask comprised about 68% by volume Ar and about 32% by volume $CHF_3$. The reactor and process conditions were as follows:

| Reactor Conditions | |
| --- | --- |
| Pressure | 60 mTorr |
| RF Power | 850 watts |
| Rotational Magnetic Field | 40 Gauss |
| Temperature of Test Wafer | 100° C. |
| Oxide Mask Etch Rate | 3000 Å/min |

| Process Conditions Based on the Flow Rate of Ar and $CHF_3$ | |
| --- | --- |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN conductive layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 150 watts |
| Temperature of Test Wafer | 110° C. |
| TiN Etch Rate | 2000 Å/min |

| Process Conditions Based on the Flow Rate of Ar and $Cl_2$ and $BCl_3$ | |
| --- | --- |
| Ar | 30 sccm |
| $Cl_2$ | 50 sccm |
| $BCl_3$ | 50 sccm |
| Pressure | 12 mTorr |
| RF Power to Coil Inductor | 150 watts |
| RF Power to Wafer Pedestal | 150 watts |

-continued

| Process Conditions Based on the Flow Rate of Ar and $Cl_2$ and $BCl_3$ | |
| --- | --- |
| Temperature of Test Wafer | 110° C. |
| TiN Etch Rate | 2000 Å/min |

The platinum layer of the test semiconductor wafer was then etched with Ar and $Cl_2$ as the etchant gas and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 200 watts |
| Temperature of Test Wafer | 320° C. |
| Platinum Etch Rate | 1000 Å/min |

| Process Conditions Based on the Flow Rate of Ar and $Cl_2$ | |
| --- | --- |
| Ar | 50 sccm |
| $Cl_2$ | 100 sccm |
| Pressure, mTorr | 12 mTorr |
| RF Power to Coil Inductor | 900 watts |
| RF Power to Wafer Pedestal | 200 watts |
| Temperature (° C.) of Test Wafer | 320° C. |
| Pt Etch Rate (Å/min) | 1000 Å/min |
| Selectivity of Pt/Oxide Mask | 0.7:1 |

The test wafer was then treated in an ASP™ brand chamber of the Metal Etch DPS Centura™ brand plasma processing apparatus under the following process conditions in order to remove corrosive residue:

| Process Conditions Based on the Flow Rate of $NH_3$ and $N_2$ | |
| --- | --- |
| $NH_3$ | 1000 sccm |
| $N_2$ | 1000 sccm |
| Pressure | 2 Torr |
| Microwave Power | 1400 watts |
| Temperature (° C.) of Test Wafer | 250° C. |
| Time of Treatment | 60 secs |

EXAMPLE II

A test semiconductor wafer was formulated with the following film stack:

1.2 m patterned PR (photoresist)/1000 TiN/1000 Å Pt/300 Å BST/Si.

The feature size of the patterned PR test semiconductor wafer was 0.75 μm line and 0.75 μm spacing.

The TiN conductive layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 150 watts |
| Temperature of Test Wafer | 110° C. |
| TiN Etch Rate | 2000 Å/min |

| Process Conditions Based on the Flow Rate of Ar and $Cl_2$ and $BCl_3$ | |
| --- | --- |
| Ar | 30 sccm |
| $Cl_2$ | 50 sccm |
| $BCl_3$ | 50 sccm |
| Pressure | 12 mTorr |
| RF Power to Coil Inductor | 900 watts |
| RF Power to Wafer Pedestal | 150 watts |
| Temperature of Test Wafer | 110° C. |
| TiN Etch Rate | 2000 Å/min |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The platinum layer of the test semiconductor wafer was then etched with Ar and $Cl_2$ and $O_2$ as the etchant gas and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 1200 watts |
| RF Power to Wafer Pedestal | 300 watts |
| Temperature of Test Wafer | 320° C. |
| Platinum Etch Rate | 250 Å/min |

| Process Conditions Based on the Flow Rate of Ar and $Cl_2$ and $O_2$ | |
| --- | --- |
| Ar | 80 sccm |
| $Cl_2$ | 40 sccm |
| $O_2$ | 24 sccm |
| Pressure, mTorr | 12 mTorr |
| RF Power to Coil Inductor | 1200 watts |
| RF Power to Wafer Pedestal | 300 watts |
| Temperature (° C.) of Test Wafer | 320° C. |
| Pt Etch Rate (Å/min) | 250 Å/min |
| Selectivity of Pt/TiN Mask | 10:1 |

The test wafer was then treated for 60 secs. with DI water under pressure from a water gun. All corrosive residue was dissolved in the water and/or otherwise removed.

EXAMPLE III

A test semiconductor wafer was formulated with the following film stack:

0.8 µm patterned PR (photoresist)/4600 Å TEOS/600 Å TiN/500 Å Pt/400 Å BST.

The TEOS mask (i.e., the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the TEOS mask comprised about 68% by volume Ar and about 32% by volume $CHF_3$. The reactor and process conditions were as follows:

| Reactor Conditions | |
| --- | --- |
| Pressure | 60 mTorr |
| RF Power | 850 watts |
| Rotational Magnetic Field | 40 Gauss |
| Temperature of Test Wafer | 100° C. |
| TEOS Mask Etch Rate | 3000 Å/min |

| Process Conditions Based on the Flow Rate of Ar and $CHF_3$ | |
| --- | --- |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| TEOS Mask Etch Rate (Å/min) | 3000 Å/min |
| Magnetic Field (Gauss) | 40 Gauss |

The photoresist was stripped from the TEOS mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min. |

| Process Conditions Based on the Flow Rate of Ar and $Cl_2$ and $BCl_3$ | |
| --- | --- |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

The platinum layer of the test semiconductor wafer was then etched with Ar, $N_2$ and $BCl_3$ as the etchant gas and in a DPS™ brand chamber of the Metal Etch DPS Centura™ brand plasma processing apparatus under the following reactor and process conditions:

| Reactor Conditions | |
|---|---|
| Pressure | 24 mTorr |
| RF Power to Coil Inductor | 1200 watts |
| RF Power to Wafer Pedestal | 150 watts |
| Temperature of Test Wafer | 320° C. |
| Platinum Etch Rate | 300 Å/min |

| Process Conditions Based on the Flow Rate of Ar and Cl$_2$ and BCl$_3$ | |
|---|---|
| Ar | 100 sccm |
| BCl$_3$ | 10 sccm |
| N$_2$ | 50 sccm |
| Pressure, mTorr | 24 mTorr |
| RF Power to Coil Inductor | 1200 watts |
| RF Power to Wafer Pedestal | 150 watts |
| Temperature (° C.) of Test Wafer | 320° C. |
| Pt Etch Rate (Å/min) | 300 Å/min |
| Selectivity of Pt/TEOS Mask | 1:1 |

The exposed part of BST layer of the test semiconductor wafer was then etched with Ar, N$_2$ and BCl$_3$ as etchant gases in a DPS™ brand chamber of the Metal Etch DPS Centura™ brand plasma processing apparatus under the following reactor and process conditions:

| Reactor Conditions | |
|---|---|
| Pressure | 24 mTorr |
| RF Power to Coil Inductor | 1200 watts |
| RF Power to Wafer Pedestal | 450 watts |
| Temperature of Test Wafer | 320° C. |
| BST Etch Rate | 400 Å/min |

| Process Conditions Based on the Flow Rate of Ar, N$_2$ and BCl$_2$ | |
|---|---|
| Ar | 100 sccm |
| N$_2$ | 50 sccm |
| BCl$_3$ | 5 sccm |
| Pressure | 24 mTorr |
| RF Power to Coil Inductor | 1200 watts |
| RF Power to Wafer Pedestal | 450 watts |
| Temperature (° C.) of Test Wafer | 320° C. |
| BST Etch Rate | 400 Å/min |

Figure 11:
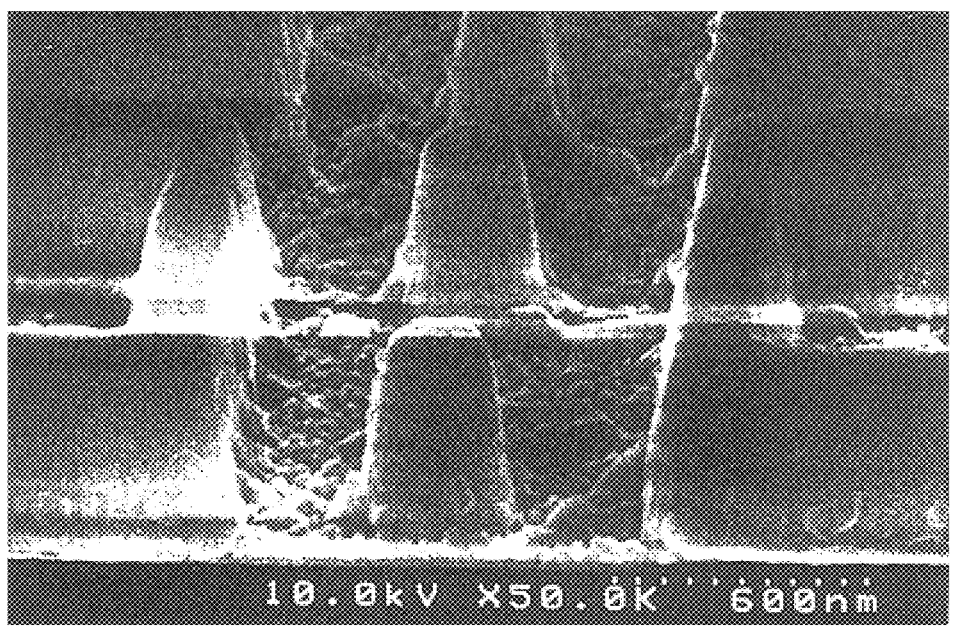
FIG. 11 is a picture of the test semiconductor wafer for Example III before treatment in a DPS™ etch chamber for removal of the shown corrosive residue.

FIG. 11 is a picture of the test semiconductor wafer after the exposed part of the BST layer was etched and shows corrosive residue.

The test wafer was then treated with NH$_3$ and N$_2$ gases in a DPS™ brand chamber of the Metal Etch DPS Centura™ brand plasma processing apparatus under the following reactor and process conditions.

| Reactor Conditions | |
|---|---|
| Pressure | 24 mTorr |
| RF Power to Coil Inductor | 1600 watts |
| RF Power to Wafer Pedestal | 200 watts |
| Temperature of Test Wafer | 100° C. |

| Process Conditions Based on the Flow Rate of NH$_3$ and N$_2$ | |
|---|---|
| NH$_3$ | 95 sccm |
| N$_2$ | 50 sccm |
| Pressure, mTorr | 24 mTorr |
| RF Power to Coil Inductor | 1600 watts |
| RF Power to Wafer Pedestal | 200 watts |
| Temperature (° C.) of Test Wafer | 100° C. |
| Treating Time | 120 seconds |

Figure 12:
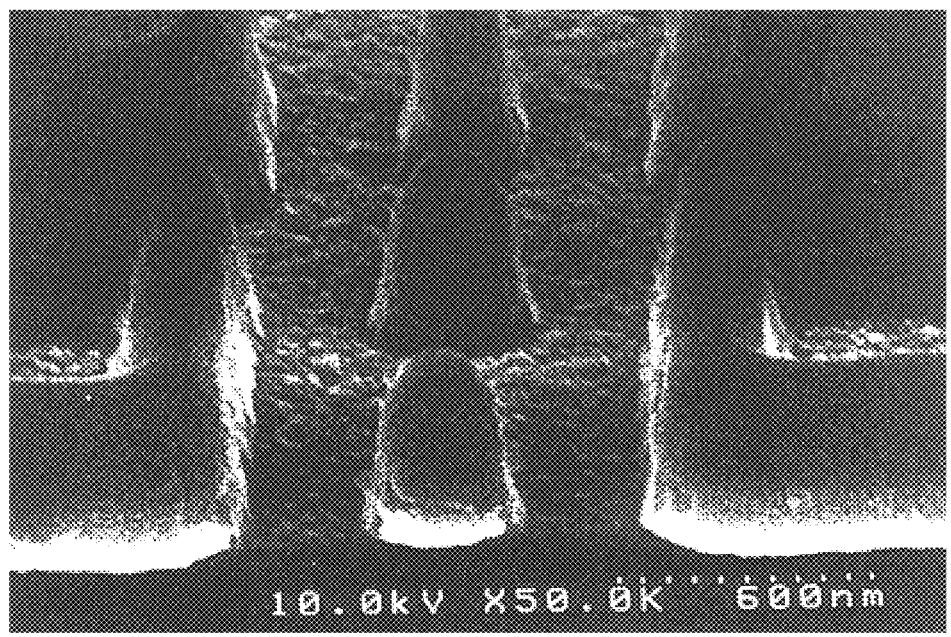
FIG. 12 is a picture of the test semiconductor wafer after treatment in the DPS™ etch chamber for removal of the corrosive residue.

FIG. 12 is a picture of the test wafer after treatment in the DPS™ brand chamber with NH$_3$ and N$_2$ gases.

CONCLUSION

Thus, by the practice of the present invention there is provided a method for preventing corrosion of a dielectric layer (e.g., a BST dielectric layer) supporting a metal layer which is to be etched with an etchant gas containing at least one corrosive gas. Etching of the metal layer with a corrosive gas causes a surface of the underlying dielectric layer to receive a corrosive residue which if not removed would eventually corrode the dielectric layer, especially if the corrosive residue comes in contact with moisture, causing the formation of acids. The surface of the dielectric layer is treated (e.g., with a plasma of a gas) to remove the corrosive residue therefrom. Preferably, the surface of the dielectric layer is treated in an ASP stripping chamber with microwave downstream hydrogen-containing gas plasma.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment(s) disclosed as the best mode contemplated for carrying out this invention, but that the invention will include all embodiments and equivalents falling within the scope of the appended claims.

What is claimed is:

1. A method of treating a surface of an inorganic dielectric layer disposed on a substrate to remove corrosive residue from said surface of said inorganic dielectric layer, said method comprising the steps of:
   a) providing a substrate supporting an inorganic dielectric layer having a corrosive residue on a surface thereof; and
   b) treating said surface of said inorganic dielectric layer by contacting said surface of said inorganic dielectric layer with a plasma generated from a source gas including at least 37 atomic percent of a hydrogen-containing gas, to remove said corrosive residue and prevent corrosion of said inorganic dielectric layer.

2. The method of claim 1 wherein said treating of said surface of said inorganic dielectric layer comprises disposing said substrate in a reactor chamber under vacuum and containing a plasma generated from a source gas including at least 37 atomic percent of a hydrogen-containing gas.

3. The method of claim 2 wherein said reactor chamber is operated using the following process conditions: a total source gas flow ranging from about 50 sccm to about 10,000 sccm, a reactor chamber pressure ranging from about 50 m Torr to about 100,000 mTorr, a microwave power ranging from about 100 W to about 5000 W, and a substrate temperature ranging from about 20° C. to about 500° C.

4. The method of claim 2 wherein said source gas comprises $NH_3$ and $N_2$.

5. The method of claim 4 wherein said reactor chamber is operated using the following process conditions: a total source gas flow ranging from about 50 sccm to about 10,000 sccm, a reactor chamber pressure ranging from about 50 mTorr to about 100,000 mTorr, a microwave power ranging from about 100 W to about 5000 W, and a substrate temperature ranging from about 20° C. to about 500° C., wherein $N_2$ comprises about 1% to about 67% by volume of said source gas, and $NH_3$ comprises about 33% to about 99% by volume of said source gas.

6. The method of claim 1 wherein said inorganic dielectric layer comprises a ceramic.

7. The method of claim 6 wherein said ceramic comprises barium titanate ($BaTiO_3$).

8. The method of claim 1 wherein said inorganic dielectric layer comprises a compound selected from the group consisting of barium titanate ($BaTiO_3$), strontium titanate ($SrTiO_3$), strontium bismuth tantalate ($SrBi_2Ta_2O_9$), and mixtures thereof.

9. The method of claim 1 wherein said hydrogen-containing gas is selected from the group consisting of water vapor ($H_2O$), hydrogen, $NH_3$, $CH_4$, $H_2O_2$, forming gas ($H_2+N_2$), and mixtures thereof.

10. A method of treating a surface of an inorganic dielectric layer disposed on a substrate to remove corrosive residue from said surface of said inorganic dielectric layer, said method comprising the steps of:
 a) providing a substrate supporting an inorganic dielectric layer and a metal layer overlying the dielectric layer;
 b) etching said metal layer in a plasma of an etchant gas containing at least one corrosive gas to expose a surface of said inorganic dielectric layer and cause the formation of a corrosive residue on the surface of said inorganic dielectric layer; and
 c) post-etch treating said surface of said inorganic dielectric layer by contacting said surface of said inorganic dielectric layer with a plasma generated from a source gas including at least 37 atomic percent of a hydrogen-containing gas to remove said corrosive residue and prevent corrosion of said inorganic dielectric layer.

11. The method of claim 10 wherein said metal layer comprises an element selected from the group consisting of platinum and iridium.

12. The method of claim 10 wherein said post-etch treating comprises disposing said substrate in a reactor chamber under vacuum and containing a plasma generated from a source gas including at least 37 atomic percent of a hydrogen-containing gas.

13. The method of claim 12 wherein said reactor chamber is operated using the following process conditions: a total source gas flow ranging from about 50 sccm to about 10,000 sccm, a reactor chamber pressure ranging from about 50 mTorr to about 100,000 mTorr, a microwave power ranging from about 100 W to about 5000 W, and a substrate temperature ranging from about 20° C. to about 500° C., wherein $N_2$ comprises about 1% to about 67% by volume of said source gas, and $NH_3$ comprises about 33% to about 99% by volume of said source gas.

14. The method of claim 10 wherein said inorganic dielectric layer comprises a compound selected from the group consisting of barium titanate ($BaTiO_3$), strontium titanate ($SrTiO_3$), and mixtures thereof.

15. The method of claim 12 wherein said corrosive gas comprises chlorine.

16. The method of claim 10 wherein said hydrogen-containing gas is selected from the group consisting of water vapor ($H_2O$), hydrogen, $NH_3$, $CH_4$, $H_2O_2$, forming gas ($H_2+N_2$), and mixtures thereof.

17. A method of treating a surface of an inorganic dielectric layer disposed on a substrate to remove corrosive residue from said surface of said inorganic dielectric layer, said method comprising the steps of:
 a) providing a substrate supporting a patterned, first conductive layer;
 b) depositing an inorganic dielectric layer on said patterned, first conductive layer;
 c) depositing a second conductive layer on said inorganic dielectric layer;
 d) forming a patterned, inorganic mask layer on said second conductive layer, such as to expose a portion of said second conductive layer;
 e) etching said exposed portion of said second conductive layer in a plasma of an etchant gas containing at least one corrosive gas to expose a surface of said inorganic dielectric layer and cause a corrosive residue to be deposited on said surface of said inorganic dielectric layer; and
 f) post-etch treating said surface of said inorganic dielectric layer by contacting said surface of said inorganic dielectric layer with a plasma generated from a source gas including at least 37 atomic percent of a hydrogen-containing gas in order to remove said corrosive residue.

18. The method of claim 19 wherein said post-etch treating comprises disposing said substrate in a reactor chamber of a reactor under a vacuum and containing a plasma generated from a source gas including at least 37 atomic percent of a hydrogen-containing gas.

19. The method of claim 1 wherein said source gas further includes a non-hydrogen-containing gas.

20. The method of claim 1 wherein said inorganic dielectric layer comprises a ferroelectric material.

21. The method of claim 10 wherein said inorganic dielectric layer comprises a ferroelectric material.

22. The method of claim 17 wherein said inorganic dielectric layer comprises a ferroelectric material.

23. The method of claim 10 wherein said source gas further includes a non-hydrogen-containing gas.

24. The method of claim 10 wherein said post-etch treating comprises disposing said substrate in a reactor chamber operating using the following process conditions: a gas flow of a hydrogen-containing gas ranging from about 30 sccm to about 500 sccm, a reactor chamber pressure ranging from about 0.1 mTorr to about 300 mTorr, an RF power to a coil inductor ranging from about 100 W to about 5000 W at a frequency ranging from about 100 kHz to about 300 MHz, an RF power to a substrate support means ranging from about 50 W to about 3000 W at a frequency of about 100 kHz to about 300 MHz, and a substrate temperature ranging from about 20° C. to about 500° C.

25. The method of claim 23 wherein said post-etch treating comprises disposing said substrate in a reactor chamber operating using the following process conditions: a gas flow of a hydrogen-containing gas ranging from about 20 sccm to about 300 sccm, a gas flow of a non-hydrogen-containing gas ranging from about 20 sccm to about 200 sccm, a reactor chamber pressure ranging from about 0.1 mTorr to about 300 mTorr, an RF power to a coil inductor ranging from about 100 W to about 5000 W at a frequency of about 100 kHz to about 300 MHz, an RF power to a substrate support means ranging from about 50 W to about 3000 W at a frequency of about 100 kHz to about 300 MHz, and a substrate temperature of about 20° C. to about 500° C.

26. The method of claim 19 wherein said non-hydrogen-containing gas is selected from the group consisting of nitrogen, oxygen, argon, helium, neon, krypton, and xenon.

27. The method of claim 23 wherein said non-hydrogen-containing gas is selected from the group consisting of nitrogen, oxygen, argon, helium, neon, krypton, and xenon.

28. The method of claim 12 wherein said source gas comprises $NH_3$ and $N_2$.

29. The method of claim 17 wherein said hydrogen-containing gas is selected from the group consisting of water vapor ($H_2O$), hydrogen, $NH_3$, $CH_4$, $H_2O_2$, forming gas ($H_2+N_2$), a mixtures thereof.

30. The method of claim 17 wherein said source gas further includes a non-hydrogen-containing gas.

31. The method of claim 30 wherein said non-hydrogen-containing gas is selected from the group consisting of nitrogen, oxygen, argon, helium, neon, krypton, and xenon.

32. The method of claim 18 wherein said source gas comprises $NH_3$ and $N_2$.

* * * * *